United States Patent
Shibagaki et al.

(10) Patent No.: US 9,431,281 B2
(45) Date of Patent: Aug. 30, 2016

(54) TEMPERATURE CONTROL METHOD FOR SUBSTRATE HEAT TREATMENT APPARATUS, SEMICONDUCTOR DEVICE MANUFACTURING METHOD, TEMPERATURE CONTROL PROGRAM FOR SUBSTRATE HEAT TREATMENT APPARATUS, AND RECORDING MEDIUM

(75) Inventors: Masami Shibagaki, Fuchu (JP); Kaori Mashimo, Kawasaki (JP)

(73) Assignee: CANON ANELVA CORPORATION, Kawasaki-Shi (JP)

( * ) Notice: Subject to any disclaimer, the term of this patent is extended or adjusted under 35 U.S.C. 154(b) by 1111 days.

(21) Appl. No.: 13/511,092

(22) PCT Filed: Dec. 21, 2010

(86) PCT No.: PCT/JP2010/007397
§ 371 (c)(1),
(2), (4) Date: May 21, 2012

(87) PCT Pub. No.: WO2011/077702
PCT Pub. Date: Jun. 30, 2011

(65) Prior Publication Data
US 2012/0219921 A1 Aug. 30, 2012

(30) Foreign Application Priority Data
Dec. 25, 2009 (JP) .................................. 2009-295665

(51) Int. Cl.
*F27D 19/00* (2006.01)
*H01L 21/425* (2006.01)
(Continued)

(52) U.S. Cl.
CPC ................................ *H01L 21/67248* (2013.01)

(58) Field of Classification Search
CPC ................................................ H01L 21/67248

USPC ........... 432/9, 31; 392/416, 418; 438/5, 518, 438/522, 530, 514; 700/299, 297; 257/77; 702/64, 109, 130
See application file for complete search history.

(56) References Cited

U.S. PATENT DOCUMENTS 4,688,180 A * 8/1987 Motomiya .............. F27B 9/029
432/11
4,761,538 A 8/1988 Chiba et al.
(Continued)

FOREIGN PATENT DOCUMENTS

JP 62-160512 A 7/1987
JP 7-312351 A 11/1995
(Continued)

*Primary Examiner* — Alissa Tompkins
*Assistant Examiner* — Benjamin W Johnson
(74) *Attorney, Agent, or Firm* — Fitzpatrick, Cella, Harper & Scinto (57) ABSTRACT

The present invention provides a temperature control method for a substrate heat treatment apparatus that achieves high throughput while securing stability in rapid heating where a large-diameter silicon carbide (SiC) substrate having impurity ions implanted thereinto is subjected to an activation annealing treatment.

A temperature control method for a substrate heat treatment apparatus (1) that includes a heating element includes: increasing the treatment temperature; continuing the temperature increase by reducing the value of power in a stepwise manner after the treatment temperature reaches a preset temperature (T1) before reaching the annealing temperature, the power being applied to heat the heating element; and maintaining the treatment temperature at a fixed value until an annealing treatment is completed after the treatment temperature reaches the annealing temperature (TA).

4 Claims, 8 Drawing Sheets

(51) Int. Cl.
*G05D 23/00* (2006.01)
*H01L 21/67* (2006.01)

(56) References Cited

U.S. PATENT DOCUMENTS

| | | | |
|---|---|---|---|
| 5,688,116 A | 11/1997 | Kobayashi et al. | |
| 5,775,889 A | 7/1998 | Kobayashi et al. | |
| 6,207,936 B1 * | 3/2001 | de Waard | G05B 13/027 219/412 |
| 7,320,733 B2 | 1/2008 | Haga | |
| 7,376,490 B2 | 5/2008 | Ueno et al. | |
| 7,586,730 B2 | 9/2009 | Haga | |
| 7,968,828 B2 | 6/2011 | Haga | |
| 8,090,245 B2 | 1/2012 | Shibagaki et al. | |
| 8,150,243 B2 | 4/2012 | Kumagai et al. | |
| 2007/0286709 A1 * | 12/2007 | Fujii | H01L 21/324 414/148 |
| 2009/0214193 A1 | 8/2009 | Suzuki et al. | |
| 2009/0218579 A1 * | 9/2009 | Shibagaki | H01L 21/046 257/77 |
| 2010/0243618 A1 | 9/2010 | Shibagaki et al. | |

FOREIGN PATENT DOCUMENTS

| | | |
|---|---|---|
| JP | 2001-044184 A | 2/2001 |
| JP | 2001-345275 A | 12/2001 |
| JP | 2005-056582 * | 3/2005 |
| JP | 2005-056582 A | 3/2005 |
| JP | 2005-056964 A | 3/2005 |
| JP | 2006-230146 A | 8/2006 |
| JP | 2008-288480 A | 11/2008 |
| JP | 2009-200401 A | 9/2009 |
| JP | 2010-096768 A | 4/2010 |
| JP | 2010-251718 A | 11/2010 |
| WO | 2008/142747 A1 | 11/2008 |
| WO | 2009/031450 A1 | 3/2009 |

* cited by examiner

TEMPERATURE CONTROL METHOD FOR SUBSTRATE HEAT TREATMENT APPARATUS, SEMICONDUCTOR DEVICE MANUFACTURING METHOD, TEMPERATURE CONTROL PROGRAM FOR SUBSTRATE HEAT TREATMENT APPARATUS, AND RECORDING MEDIUM

TECHNICAL FIELD

The present invention relates to a temperature control method for a substrate heat treatment apparatus to be used in a heat treatment process for semiconductor devices, a semiconductor device manufacturing method using the temperature control method, a temperature control program for a substrate heat treatment apparatus, and a recording medium storing the program.

BACKGROUND ART

A silicon carbide (SiC) substrate has an extremely small impurity thermal diffusion coefficient, and an impurity thermal diffusion process cannot be used for silicon carbide (SiC) substrates in practice. Therefore, to control the electrical conductivity of a SiC substrate, it is necessary to activate impurities by performing an annealing treatment at a temperature of 1500 to 2000 degrees centigrade after impurity ion implantation. Therefore, an electron bombardment heating technique is used as a technique for heating a substrate heat treatment apparatus that performs an activation annealing treatment in the above mentioned temperature range, so that each SiC substrate is rapidly heated, and excellent annealing characteristics are achieved as disclosed (see Patent Document 1, for example).

As a temperature control method for realizing rapid heating by an electron bombardment heating technique, there has also been a suggested method by which the temperature is increased up to a preset temperature while the emission current value is maintained at a fixed value, and the temperature control is switched to PID control after the temperature reaches the preset temperature (see Patent Document 2, for example).

REFERENCES

Patent Documents

[Patent Document 1] International Patent Publication No. WO2009/31450
[Patent Document 2] Japanese Patent Application Laid-Open No. 2005-56582

SUMMARY OF THE INVENTION

Problems to be Solved by the Invention

Since SiC substrates are used for high-power devices, the chip sizes have become inevitably larger, and the substrates have larger diameters. Therefore, there has been an industrial demand for substrate heat treatment apparatuses using an electron bombardment heating technique that are capable of performing an activation annealing process for large-diameter SiC substrates. For example, to deal with a SiC substrate having a diameter of φ100 mm or larger, the diameter of the heat release face of the heater needs to be φ150 mm or larger, and the heat capacity of the heater is inevitably made larger.

However, where the heat capacity of the heater is made larger, the temperature responsiveness to input power becomes poorer. Therefore, in a case where temperature control is performed through PID control (proportional, integral, and differential control) as disclosed in Patent Document 2, hunting occurs when rapid heating is performed, and the treatment temperature cannot be stabilized. To perform stable temperature control, the temperature needs to be increased very slowly. As a result, the throughput becomes lower.

The present invention aims to provide a temperature control method for a substrate heat treatment apparatus that achieves high throughput while securing stability in rapid heating where a large-diameter silicon carbide (SiC) substrate having impurity ions implanted thereinto is subjected to an activation annealing treatment.

The present invention further provides a semiconductor device manufacturing method, a temperature control program for a substrate heat treatment apparatus, and a recording medium that can achieve the above object.

Means for Solving the Problems

A structure according to the present invention to achieve the above objects is as follows.

That is, a temperature control method for a substrate heat treatment apparatus according to the present invention is a temperature control method for a substrate heat treatment apparatus that includes a heating element in an evacuable treatment chamber, and subjects a substrate to a heat treatment with the heating element, the method comprising:
increasing a treatment temperature;
continuing the temperature increase by reducing the value of power in a stepwise manner after the treatment temperature reaches a preset temperature before reaching an annealing temperature, the power being applied to heat the heating element; and
maintaining the treatment temperature at a fixed value until an annealing treatment is completed after the treatment temperature reaches the annealing temperature.

Another temperature control method for a substrate heat treatment apparatus according to the present invention is a temperature control method for a substrate heat treatment apparatus that includes a conductive heating container in an evacuable treatment chamber, and subjects a substrate to a heat treatment with heat of the heating container, a filament being incorporated into the heating container, thermal electrons generated from the filament being accelerated by an accelerating voltage applied between the filament and the heating container from an accelerating power source, the heating container being heated by causing the accelerated thermal electrons to collide with the heating container, the method comprising:
increasing a treatment temperature;
continuing the temperature increase by reducing the emission current value of the accelerating power source in a stepwise manner, after the treatment temperature reaches a preset temperature before reaching an annealing temperature; and
maintaining the treatment temperature at a fixed value until an annealing treatment is completed after the treatment temperature reaches the annealing temperature.

Advantages of the Invention

According to the present invention, after the temperature being increased reaches the preset temperature before reaching the annealing temperature, the emission current value is reduced in a stepwise manner, and the temperature continues to be increased. Accordingly, the responsiveness of the temperature to the control is higher than that in a case where PID control is performed. Accordingly, stability is secured in the rapid heating in the activation annealing treatment, and high throughput can be advantageously achieved.

BEST MODE FOR CARRYING OUT THE INVENTION

The following is a description of an embodiment of the present invention, with reference to the accompanying drawings. However, the present invention is not limited to this embodiment.

Figure 1:
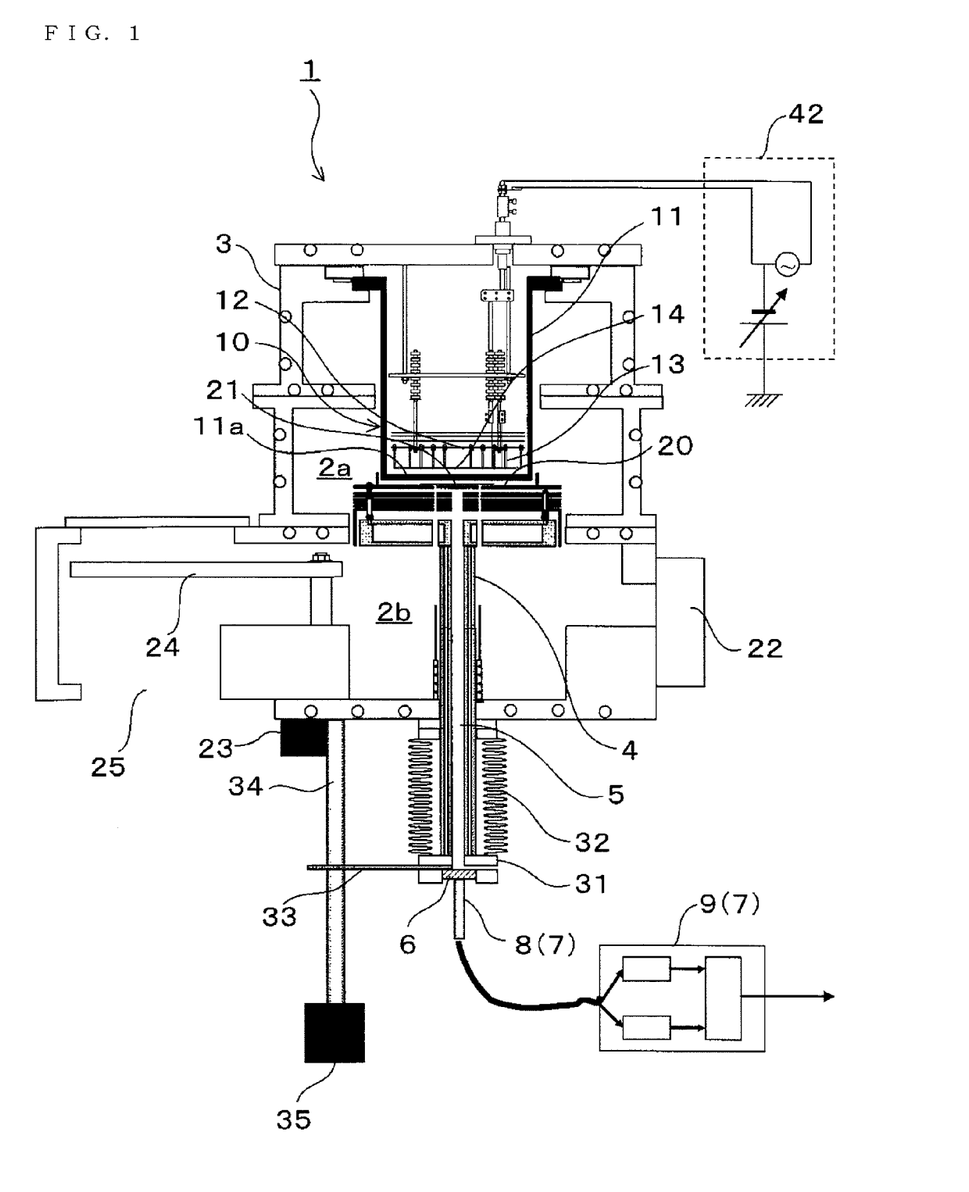
FIG. 1 is a schematic view schematically showing the entire structure of an electron bombardment heating apparatus to which a temperature control method of the present invention is applied.

Referring first to FIG. 1, an embodiment of a substrate heat treatment apparatus (hereinafter referred to as the "electron bombardment heating apparatus") that uses an electron bombardment heating technique according to the present invention is described. FIG. 1 is a schematic view schematically showing the entire structure of the electron bombardment heating apparatus.

The electron bombardment heating apparatus 1 used in the present invention applies an accelerating voltage from an accelerating power source 42 to thermal electrons generated from a filament 14, causes the accelerated thermal electrons to collide with a heating container 11 to heat the heating container 11, and subjects a substrate 21 that is to be treated and is positioned to face a heat release face 11a, to a heat treatment. The electron bombardment heating apparatus 1 includes an evacuable vacuum, container 3 that has compartments while connecting a treatment chamber 2a in which the substrate 21 to be treated is subjected to a heat treatment, to a standby chamber 2b. A heating apparatus 10 (hereinafter referred to as the "heater") into which the filament 14 is incorporated is provided in the treatment chamber 2a in the upper portion.

The heater 10 includes the cylindrical heating container 11 having one end closed, a filament base 12 housed inside the heating container 11, support pillars 13, and the filament 14.

The filament 14 is stretched almost parallel to the closed end face 11a (the heat release face of the heater 10) of the heating container 11 over the tantalum support pillars 13 that have a diameter of ϕ2 mm and stand on the filament base 12 made of a carbon fiber reinforced composite material (hereinafter referred to as a "CC composite"), for example.

The filament 14 may be a tungsten-rhenium wire or a tungsten wire to which, for example, potassium or a rare earth element such as lanthanum is added. Such a wire has a diameter of ϕ0.8 mm and a length of 900 mm.

The heating container 11 is made of a conductive material. Specifically, the external surface of the heating container 11 is coated with pyrolytic carbon, for example, to reduce emitted gas. The heating container 11 is connected to an evacuating unit (not shown), and the inside of the heating container 11 is evacuable independently of the vacuum container 3.

A substrate stage 20 made of a CC composite is also positioned to face the closed end face 11e (the heat release face of the heater 10) of the heating container 11. The substrate (a wafer) 21 that is to be treated and face the heater 10 is placed on the substrate stage 20. In this embodiment, the substrate 21 to be treated is a silicon carbide (SiC) substrate, for example. However, the present invention is not limited to that.

The substrate stage 20 is supported by a cylindrical support pillar 4, and a two-color radiation thermometer 7 is connected to the top end of the through hole 5 in the support pillar 4 via a viewing port 6 made of quartz. The viewing port 6 blocks the vacuum space, to separate the vacuum state from the atmospheric state. Light emitted from the substrate stage 20 or the substrate 21 to be treated reaches the two-color radiation thermometer 7 through the viewing port 6.

The two-color radiation thermometer 7 includes a light collector 8 and a detector 9, for example, and indirectly measures the temperature of the heater 10 via the substrate stage 20 made of a CC composite. In the temperature measurement, not only the temperature of the substrate stage 20 is measured, but also the temperature of the heat release face 11a of the heater 10 or the temperature of a side face of the heater 10 may be measured.

A support plate 31 is fixed to the lower end of the support pillar 4, and bellows 32 are interposed between the support plate 31 and the vacuum container 3. Further, an elevating arm 33 having a screw hole (not shown) formed therein is fixed to the support plate 31, and a ball screw 34 connected to a rotary drive apparatus 35 is inserted through the screw hole of the elevating arm 33. That is, when the ball screw 34 is rotated by the rotary drive apparatus 35, the elevating arm 33 moves up and down along the ball screw 34, and the substrate stage 20 connected to the elevating arm 33 through the support pillar 4 and the like can also move up and down.

The inside of the vacuum container 3 is evacuated by an evacuating apparatus (not shown) connected to an exhaust outlet 25. A slit valve 22 is provided on one sidewall of the standby chamber 2b of the vacuum container 3. When the slit valve 22 is opened, the substrate 21 to be treated is transferred into the vacuum container 3 by a transfer robot (not shown) or is transported out of the vacuum container 3. Further, a water-cooled shutter 24 connected to a turning apparatus 23 is provided in a horizontally rotatable manner in the standby chamber 2b of the vacuum container 3. When the substrate stage 20 moves back into the standby chamber 2b, the water-cooled shutter 24 enters between the substrate stage 20 and the heat release face 11a of the heater 10, so that the substrate 21 to be treated is shielded from the heat release face 11a.

Figure 3:
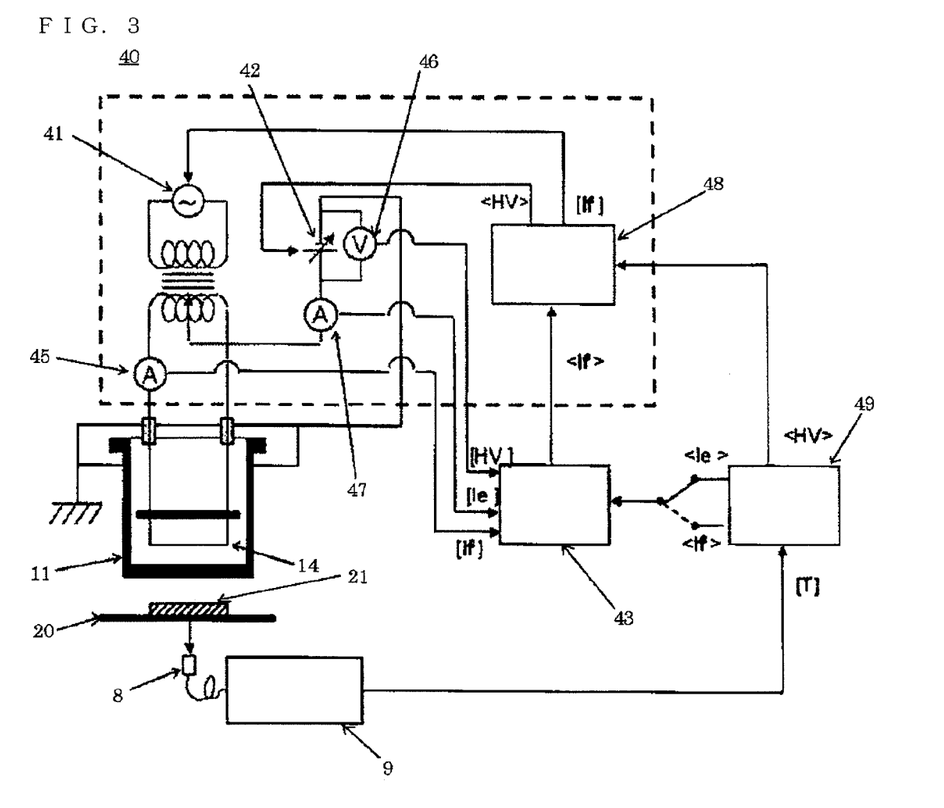
FIG. 3 is a schematic view showing the structure of the control system of the electron bombardment heating apparatus.

Referring now to FIG. 3, an example structure of the control system provided in the electron bombardment heating apparatus of FIG. 1 is described. FIG. 3 is a schematic view showing the structure of the control system of the electron bombardment heating apparatus.

As shown in FIG. 3, the control system 40 of this embodiment includes an accelerating power source, a filament power source, an accelerating voltage meter, a filament ammeter, an emission ammeter, a heating power source including a thyristor, a multifunctional temperature controller, a sequencer, a pyrometer light collector, and a pyrometer main body.

The filament power source 41 is an AC source that supplies power for heating the filament 14, and is capable of variably applying up to 50 A (ampere), for example. The filament ammeter 45 is connected to the connecting circuit for the filament 14, and measures the current value of the filament 14.

The accelerating power source (a HV source) 42 is a DC source that applies an accelerating voltage between the grounded heating container 11 and the filament 14, and is capable of variably applying an accelerating voltage of 0 V (volt) to −3.0 KV to the filament 14, for example. The accelerating voltage meter (a HV voltmeter) 46 that measures an accelerating voltage, and the emission ammeter 47 that measures an emission current value are connected to the connecting circuit for the accelerating power source 42.

The multifunctional temperature controller 43 may be SDC-46A (manufactured by Yamatake Corporation), for example. The multifunctional temperature controller 43 receives an input signal from the filament ammeter 45, an input signal from the emission ammeter 47, and an input signal from the accelerating voltage meter 46, and also receives a set value from the sequencer 49. The set value from the sequencer 49 is also input to the thyristor 48. Further, the multifunctional temperature controller 43 transmits an output signal to the filament power source 41 through the thyristor 48.

Figure 2:
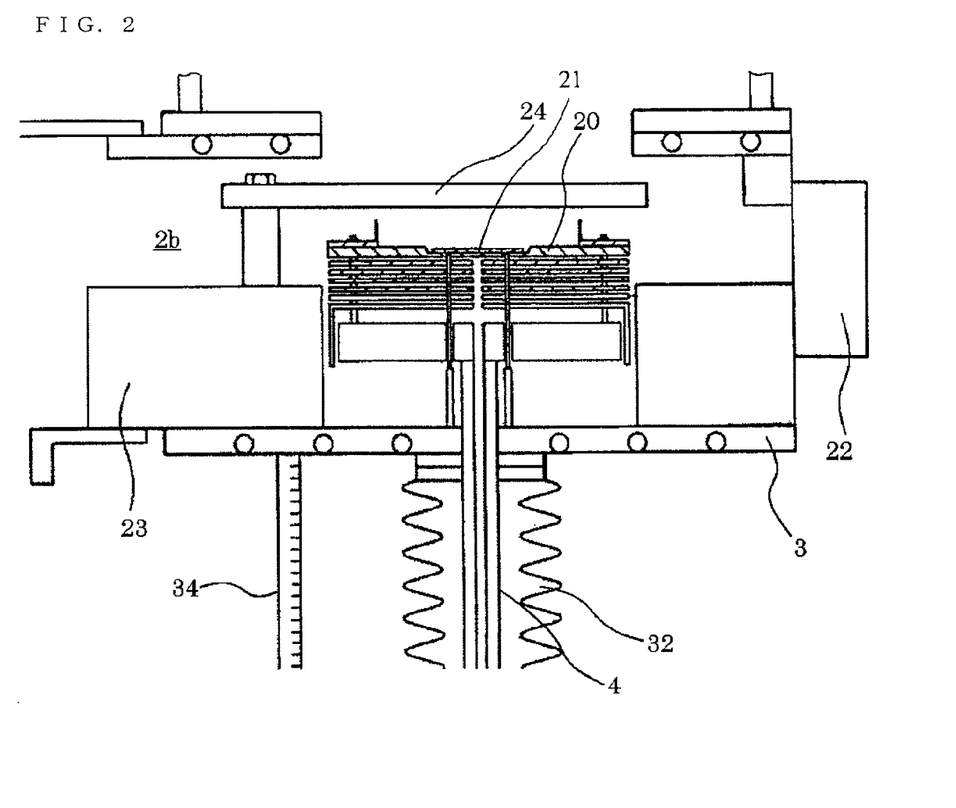
FIG. 2 is a schematic view showing a situation where the substrate stage of the electron bombardment heating apparatus of FIG. 1 is moving downward.
Figure 4:
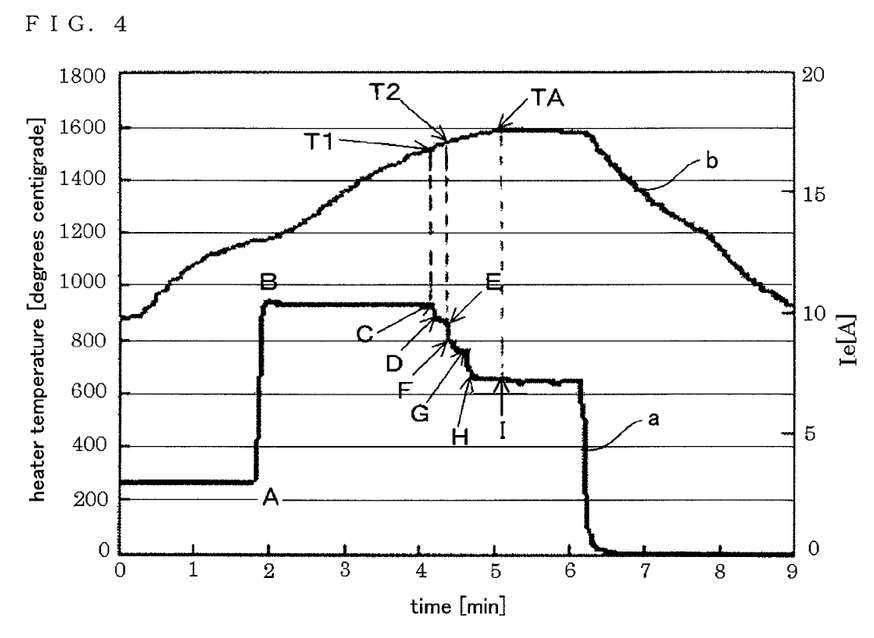
FIG. 4 is a diagram for explaining the relationship between the substrate stage temperature and the emission current value according to the temperature control method of the present invention.

Referring now to FIGS. 2 and 4, a temperature control method of this embodiment to be applied to the electron bombardment heating apparatus 1 is described. FIG. 2 is a schematic view showing a situation where the substrate stage of the electron bombardment heating apparatus of FIG. 1 is moving downward. FIG. 4 is a diagram for illustrating the relationship between the substrate stage temperature and the emission current value according to the temperature control method of the present invention.

The algorithm for the temperature control method of the present invention is stored as a temperature control program in a memory of a control apparatus (a PC), and is read and executed by the CPU when a heating treatment is started.

Here, the temperature control program is a program for causing the control apparatus to perform temperature control on the heater 10, based on a detection signal indicative of the bottom face temperature of the substrate stage 20 or the like. That is, the temperature control program of this embodiment includes the step of increasing the treatment temperature by maintaining the emission current value of the accelerating power source 42 at a fixed value. Further, the temperature control program includes the step of continuing to increase the treatment temperature by reducing the emission current value in a stepwise manner after the treatment temperature reaches the preset temperature before reaching the annealing temperature. The temperature control program further includes the step of maintaining the emission current value at the value achieved when the treatment temperature reaches the annealing temperature, until the annealing treatment is completed after the treatment temperature reaches the annealing temperature. If the annealing time is long, the emission current value may be further reduced in a stepwise manner from the value achieved when the treatment temperature reaches the annealing temperature.

The temperature control program is recorded on a recording medium that can be read by the control apparatus such as a computer (PC), and is installed in a memory of the PC.

The recording medium may be a magnetic recording medium such as a floppy disk (a registered trademark) or a ZIP (a registered trademark), an magnetooptic recording medium such as a MO, an optical disk such as a CD-R, a DVD-R, a DVD+R, a CD-R, a DVD-RAM, a DVD+RW (a registered trademark), or a PD, or the like. Alternatively, the recording medium may be a flash memory such as a compact flash (a registered trademark), a SmartMedia (a registered trademark), a memory stick (a registered trademark), or an SD card, a removable disk such as a microdrive (a registered trademark) or a Jaz (a registered trademark), or the like.

According to the temperature control method of this embodiment, the slit valve 22 (see FIG. 1) of the electron bombardment heating apparatus 1 is first opened, and the SiC substrate 21 is transferred into the standby chamber 2b of the vacuum container 3 by a transfer robot (not shown). At this point, the substrate stage 20 has moved back into the standby chamber 2b, and the water-cooled shutter 24 is interposed between the substrate stage 20 and the heat release face 11a of the heater 10 (see FIG. 2).

The slit valve 22 is then closed, and the vacuum container 3 is evacuated by an evacuating apparatus (not shown) connected to the exhaust outlet 25. After the evacuation, the turning apparatus 23 turns and retracts the water-cooled shutter 24, and the rotary drive apparatus 35 rotates the ball screw 34 to elevate the substrate stage 20.

The heater 10 of the electron bombardment heating apparatus 1 is then switched on, and the SiC substrate 21 is subjected to a heat treatment with radiation heat from the heat release face 11a. This step is described in detail, with reference to the relationship between the substrate stage temperature and the emission current value shown in FIG. 4. In FIG. 4, curve "a" represents the relationship between the time elapsed since emission current application and the emission current value. Curve "b" represents the relationship between the time elapsed since the emission current application and the substrate stage temperature.

First, the emission current value is maintained at a fixed value, and at point A, the emission current value is rapidly increased to B in a pre-heating process. After that, the treatment temperature is increased while the emission current value is maintained at a fixed value. To control the emission current value, the multifunctional temperature controller 43 first compares the input signal from the emission ammeter 47 with the set value from the sequencer 49. The multifunctional temperature controller 43 then inputs the signal value as a result of the comparison to the thyristor 48, and the filament current value is controlled by the input signal from the thyristor 48 to the filament power source 41. In this manner, the emission current value is controlled.

While the emission current value is maintained at the fixed value, the temperature of the substrate stage 20 continues to increase. At point C when the temperature of the substrate stage 20 reaches a preset temperature T1, the emission current value is reduced to D. The preset temperature T1 is set at a temperature that is lower than the annealing temperature TA by a predetermined amount. For example, where the annealing temperature TA is 1500 to 2000 degrees centigrade, the preset temperature T1 is preferably set at a temperature that is lower than the annealing temperature TA by 40 to 100 degrees centigrade. At point E when the temperature of the substrate stage 20 increases and reaches the next preset temperature T2, the emission current value is further reduced to F. The preset temperature T2 is preferably set at a temperature that is higher than the preset temperature T1 by 20 to 30 degrees centigrade.

As the temperature of the substrate stage 20 further increases, the emission current value is further reduced to H. An activation annealing treatment is performed for a predetermined period of time (one minute, for example) since point I when the temperature of the substrate stage 20 reaches the annealing temperature TA. After the annealing treatment over the predetermined period of time is completed, the emission current value is reduced to almost zero.

If the increase of the temperature of the SiC substrate 21 becomes smaller at point F, and the temperature reaches the annealing temperature TA, the annealing treatment may be started at point F.

Here, the number of times the emission current value is reduced is determined by the emission current value maintained at a fixed value to avoid an overshoot and increase the temperature at high speed during the period between the B and C. If the emission current value between point B and point C is low, the emission current value may be reduced only twice. If the emission current value during that period is high, on the other hand, the emission current value is reduced in a stepwise manner a large number of times, so that a rapid temperature increase can be achieved without an overshoot.

After a series of heating treatments such as the activation annealing treatment are finished, the heater 10 is switched off. After that, the rotary drive apparatus 35 rotates the ball screw 34 in a reverse direction so as to lower the substrate stage 20, and the turning apparatus 23 turns the water-cooled shutter 24 and inserts the water-cooled shutter 24 between the substrate stage 20 and the heat release face 11a of the heater 10 (see FIG. 2). The slit valve 22 of the electron bombardment heating apparatus 1 is then opened, and the SiC substrate 21 is transferred out of the vacuum container 3 by the transfer robot.

As described above, according to the temperature control method of this embodiment, the emission current value of the accelerating power source 42 is maintained at a fixed value to increase the temperature (between point B and point C). After the temperature reaches the preset temperature T1 before reaching the annealing temperature TA, the emission current value is reduced in a stepwise manner, and the temperature continues to be increased. Accordingly, the responsiveness of the temperature to the control is higher than that in a case where PID control is performed. This is because PID control is a type of feedback control, and is performed after a variation is detected. Therefore, the responsiveness in PID control operations is poorer. According to the temperature control method of the present invention, on the other hand, the temperature increase is continued while the emission current value is reduced in a stepwise manner. Therefore, the temperature control becomes a type of predictive control, and excels in responsiveness.

Accordingly, stability is maintained in the rapid heating in the activation annealing treatment for large-diameter silicon carbide (SiC) substrates, and high throughput can be achieved. Accordingly, the productivity in the semiconductor device manufacture using large-diameter silicon carbide (SiC) substrates can be greatly increased.

Further, the annealing treatment according to the above described temperature control method can be applied to a semiconductor device manufacturing method that includes the process of performing an annealing treatment to activate impurities after impurity ions are implanted into the SiC substrate 21. Accordingly, the productivity in the semiconductor device manufacture using the large-diameter SiC substrate 21 can be greatly increased.

Also, temperature control can be performed by measuring the bottom face temperature of the substrate stage, without direct measurement and feedback of the heater temperature.

In a case where PID control is performed while the temperature is maintained after the output of the heating source has been lowered by one level, high-speed and stable temperature control cannot be performed. The reasons for that may be as follows. That is, the heater and the substrate stage become larger as the substrate size becomes larger, and the heat capacity becomes higher as the heater and the substrate stage become larger. Also, since an ultrahigh-temperature region at 1500 degrees centigrade or higher is used in the activation annealing treatment for the SiC substrate, thermal electrons are generated from the filament. Therefore, in this temperature region, the change in filament temperature becomes slower, even if the filament current is varied.

Although the preferred embodiment of the present invention has been described so far through an electron bombardment heating apparatus as an example, the present invention may also be applied to a temperature control method using a dielectric heating apparatus or a resistance heating apparatus. The present invention is not limited to the above embodiment, and various changes may be made to the embodiment within the technical scope of the invention claimed herein. In a dielectric heating apparatus, the power to be applied to a heating element (a dielectric coil) is reduced in a stepwise manner. In a resistance heating apparatus, the power to be applied to a heating element (a heat generating resistor) is reduced in a stepwise manner.

EXAMPLES

In the following, the temperature control method for the substrate heat treatment apparatus according to the present invention will be described in greater detail through examples. However, the present invention is not limited to these examples.

Example 1

Example 1 concerns a case where the electron bombardment heating apparatus 1 of FIGS. 1 and 2 is used, and semiconductor devices are manufactured by using the temperature control method of the present invention.

In Example 1, the SiC substrate 21 that had impurities implanted thereinto and had a diameter of ϕ100 mm was subjected to an activation annealing treatment. In this example, the bottom face temperature (hereinafter referred to as the "annealing temperature") of the substrate stage 20 while the annealing temperature was maintained was 1575 degrees centigrade, and heating was performed for one minute.

According to the semiconductor device manufacturing method of Example 1, the slit valve 22 of the electron bombardment heating apparatus 1 is first opened, and the SiC substrate 21 is transferred onto the substrate stage 20 in the standby chamber 2b by a transfer robot. The SiC substrate 21 is scooped up onto the substrate stage 20, and the rotary drive apparatus 35 rotates the ball screw 34 to elevate the substrate stage 20, so that the distance between the heat release face of the heater 10 and the SiC substrate 21 becomes 5 mm.

Figure 5:
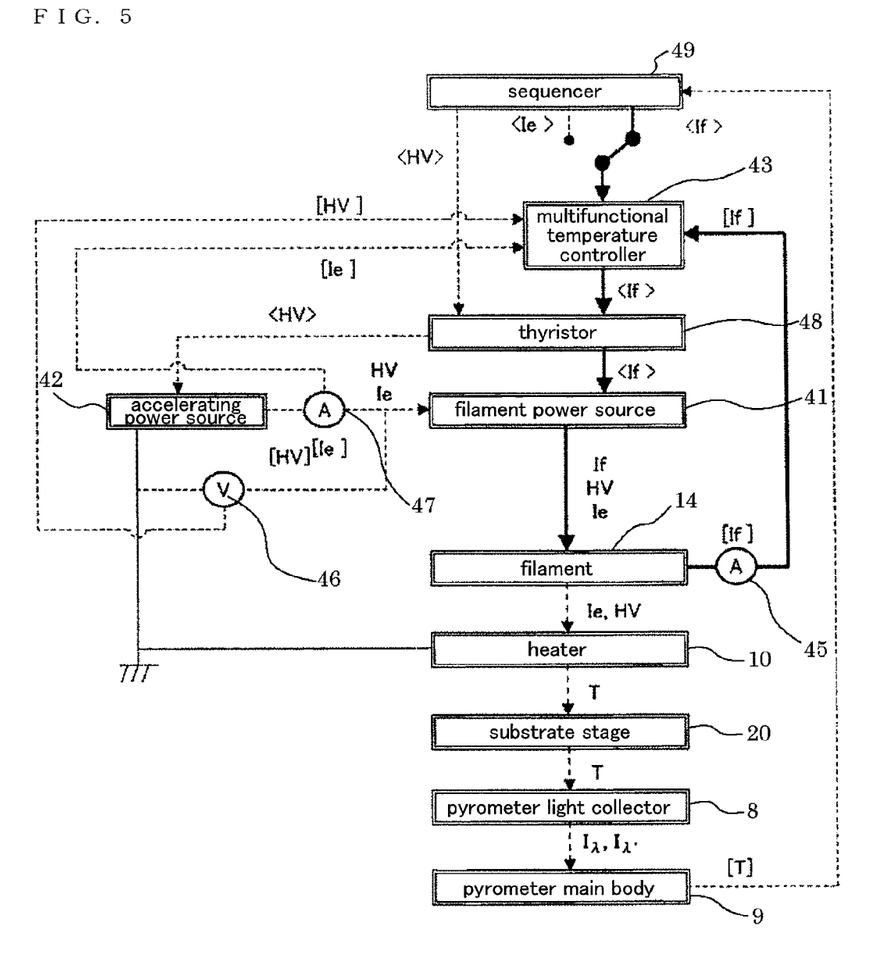
FIG. 5 is an explanatory view showing the sequence of a filament heating operation in Example 1.
Figure 6:
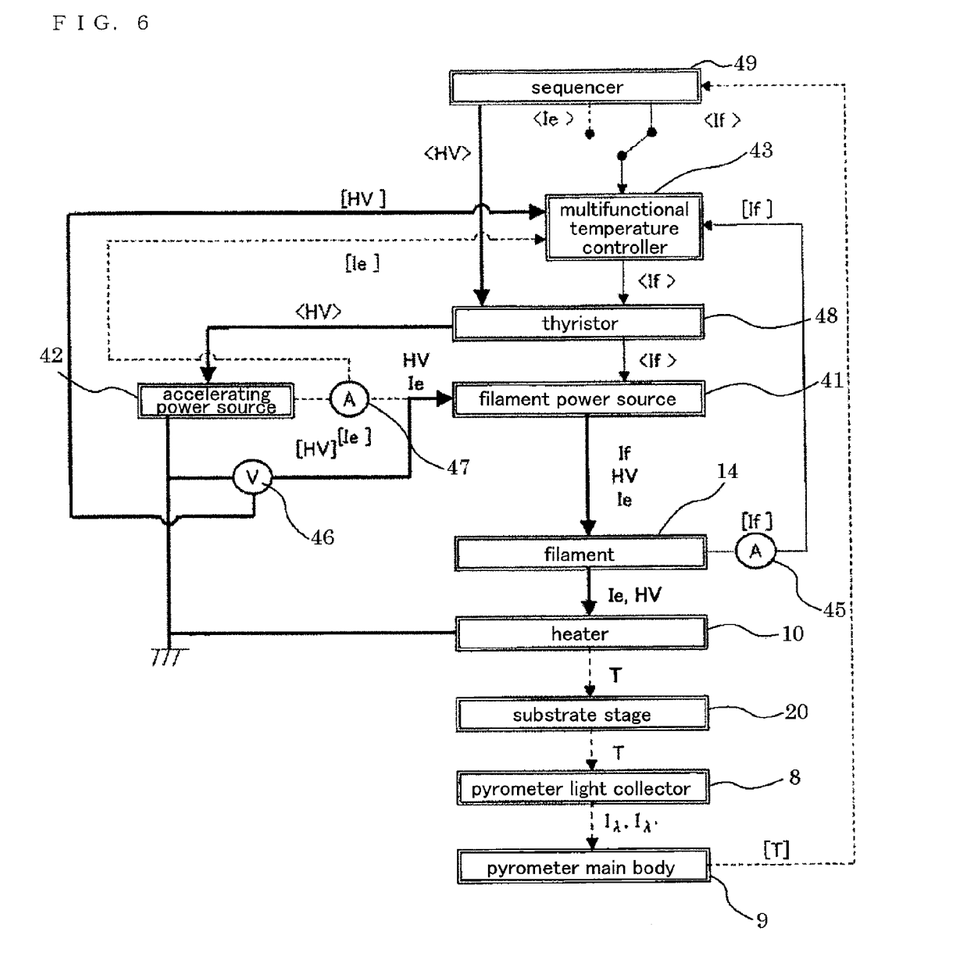
FIG. 6 is an explanatory view showing the sequence of an accelerating voltage increasing operation in Example 1.
Figure 7:
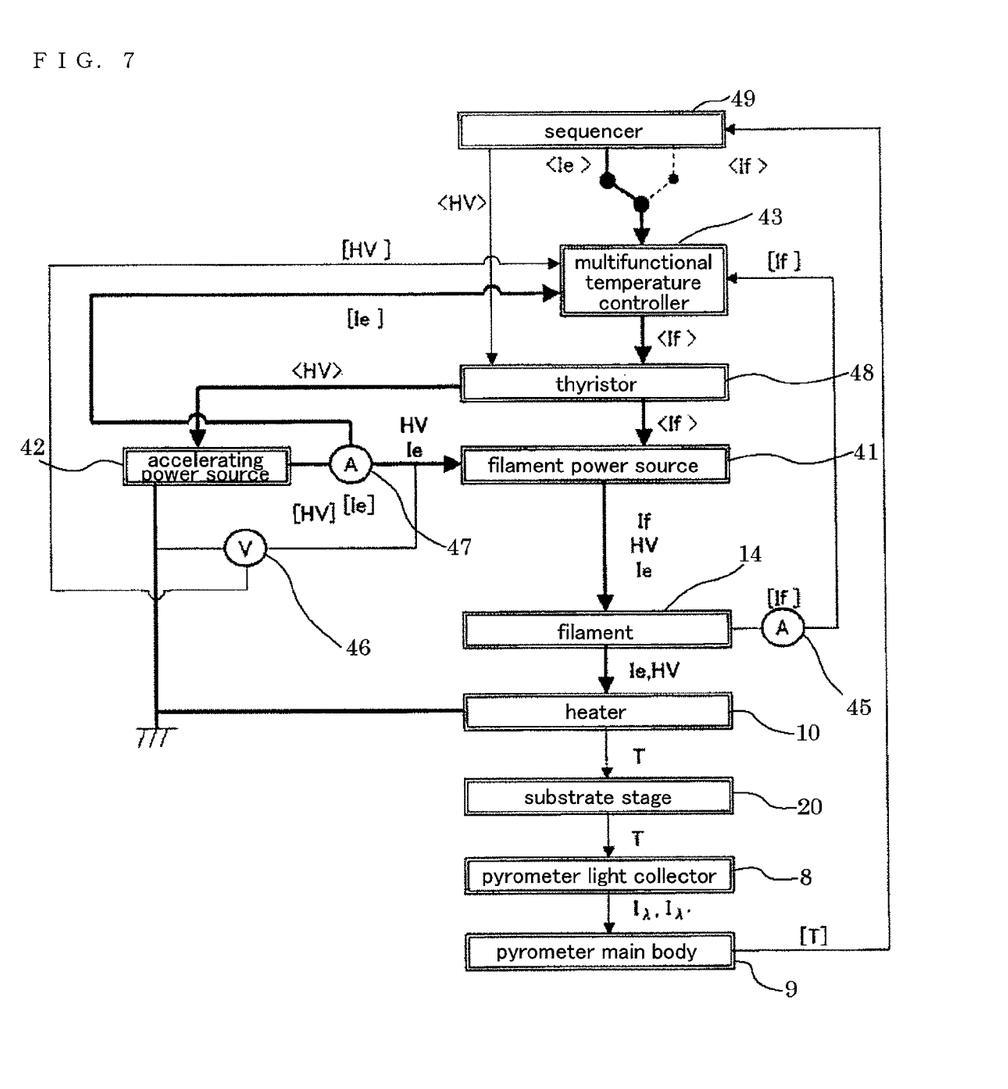
FIG. 7 is an explanatory view showing the sequence of an emission current control operation in Example 1.
Figure 8:
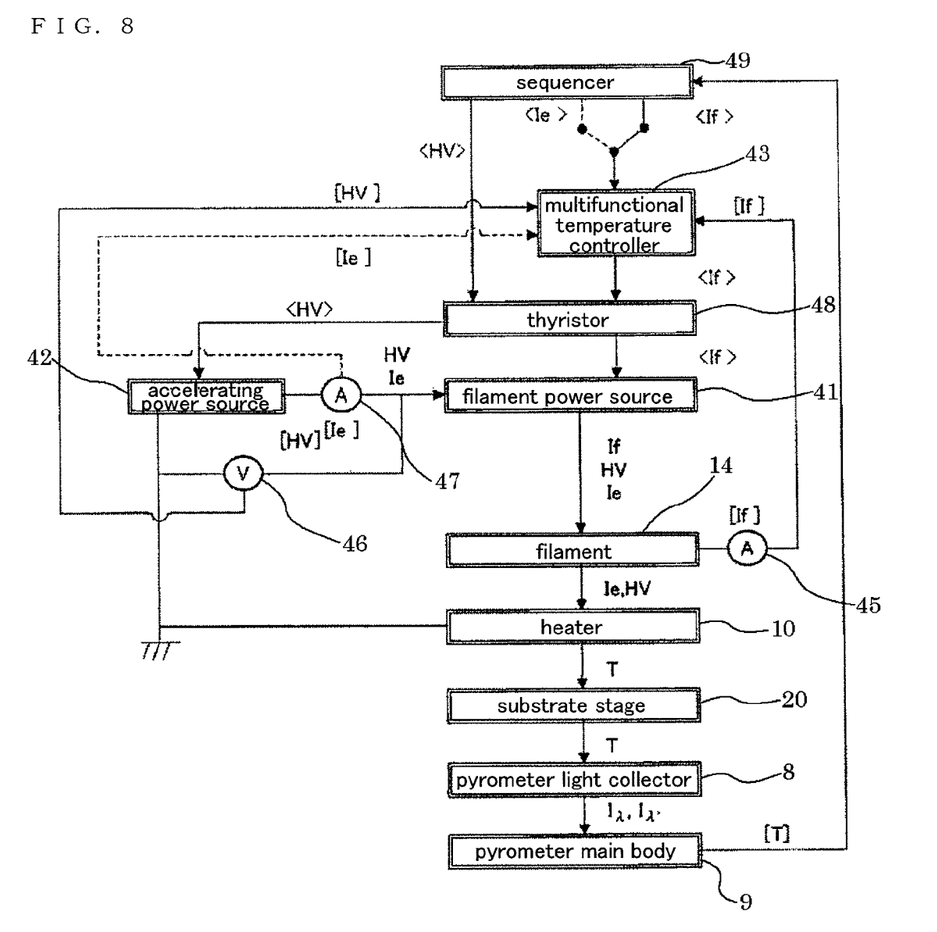
FIG. 8 is an explanatory view showing the sequence of a cooling operation in Example 1.

Referring now to the sequence circuits of FIGS. 5 through 8, the temperature control method employed in Example 1 is described. FIGS. 5 through 8 are explanatory views showing sequences to which the temperature control method according to the present invention is applied. FIG. 5 shows the sequence of a filament heating operation. FIG. 6 shows the sequence of an accelerating voltage increasing operation. FIG. 7 shows the sequence of an emission current control operation. FIG. 8 shows the sequence of a cooling operation.

(1) In a first process, the filament 14 is heated, to release the absorption gas from the filament 14 and prevent degradation of the filament 14. As shown in FIG. 5, a signal for increasing the filament current value by 1 A per second is input from the sequencer 49 to the multifunctional temperature controller 43, so that the filament current value reaches 30 A. The multifunctional temperature controller 43 then compares the signal with a return signal supplied from the filament ammeter 45, and outputs a signal to the thyristor 48. In the filament power source 41, the output of the filament current value is gradually increased in accordance with the input from the thyristor 48, so that the filament 14 is heated until the filament current value reaches 30 A.

(2) In a second process, an accelerating voltage (HV) is applied from the accelerating power source 42 to the filament 14, and the voltage is gradually increased to prevent a rapid increase of the emission current value and abnormal electrical discharge. As shown in FIG. 6, while the filament current value is fixed at 30 A, a signal is output from the sequencer 49 to the thyristor 48, so that an accelerating voltage (HV) of −500 V is applied. In accordance with the input from the thyristor 48, the accelerating power source 42 applies an accelerating voltage (HV) of −500 V to the filament 14, for example. The sequencer 49 further outputs a signal to the thyristor 48 to increase the accelerating voltage (HV) by −100 V per second, so that the accelerating voltage (HV) becomes −1800 V. In accordance with the input from the thyristor 48, the accelerating power source 42 gradually increase the output of the accelerating voltage (HV), so that the accelerating voltage (HV) becomes −1800 V, and an emission current is generated.

(3) In a third process, the absorption gas such as moisture brought into the vacuum container 3 by the SiC substrate 21 is pre-heated and removed. As shown in FIG. 7, a signal to change the emission current value to 3 A is input from the sequencer 49 to the multifunctional temperature controller 43. While the accelerating voltage (HV) is fixed at −1800 V, the signal is compared with an output signal from the emission ammeter, and a signal for controlling the filament current value is input from the multifunctional temperature controller 43 to the thyristor 48, so that the emission current value becomes 3 A. In accordance with the input signal from the thyristor 48, the filament power source 41 performs a control operation, so that the emission current value becomes 3 A. While the emission current value is 3 A, degassing is performed through 90-second pre-heating. When the pre-heating is ended, the bottom face temperature of the substrate stage 20 is 1200 degrees centigrade. This pre-heating process may be skipped for some samples.

(4) In a fourth process, while the emission current value is 10.2 A, the temperature is increased in a short period of time. As shown in FIG. 7, the sequencer 49 inputs a signal to the multifunctional temperature controller 43, so that the emission current values becomes 10.2 A. While the accelerating voltage (HV) is fixed at −1800 V, the signal is compared with an output signal from the emission ammeter, and a signal for controlling the filament current value is input from the multifunctional temperature controller 43 to the thyristor 48, so that the emission current value becomes 10.2 A. In accordance with the input signal from the thyristor 48, the filament power source 41 controls the filament current value, so that the emission current value becomes 10.2 A. In this manner, the heater temperature is rapidly increased, and the SiC substrate 21 is heated (the initial temperature increase).

(5) In a fifth process, when the bottom face temperature of the substrate stage 20 becomes 1515 degrees centigrade, the filament power source 41 compares the value of the emission ammeter with an input signal supplied through the sequencer 49, the multifunctional temperature controller 43, and the thyristor 48. The filament power source 41 further controls the filament current value so that the emission current value becomes 9.5 A. In this manner, the temperature is increased to 1535 degrees centigrade (temperature range I). At this point, the accelerating voltage (HV) is fixed at −1800 V. The emission current value is reduced from 10.2 A to 9.5 A when the temperature is 60 degrees centigrade short of the preset annealing temperature of 1575 degrees centigrade. In this manner, the temperature increase is controlled to be slower, and temperature overshoot and undershoot can be prevented.

(6) In a sixth process, when the bottom face temperature of the substrate stage 20 becomes 1535 degrees centigrade, the filament power source 41 compares the value of the emission ammeter with an input signal supplied through the sequencer 49, the multifunctional temperature controller 43, and the thyristor 48. The filament power source 41 further controls the filament current value so that the emission current value becomes 8.4 A. In this manner, the temperature is increased to 1555 degrees centigrade (temperature range II). At this point, the accelerating voltage (HV) is fixed at −1800 V.

(7) In a seventh process, when the bottom face temperature of the substrate stage 20 becomes 1555 degrees centigrade, the filament power source 41 compares the value of the emission ammeter with an input signal supplied through the sequencer 49, the multifunctional temperature controller 43, and the thyristor 48. The filament power source 41 further controls the filament current value so that the emission current value becomes 7.3 A. In this manner, the temperature is increased to 1575 degrees centigrade (temperature range III). At this point, the accelerating voltage (HV) is fixed at −1800 V.

(8) In an eighth process, when the bottom face temperature of the substrate stage 20 becomes 1575 degrees centigrade, the filament power source 41 compares the value of the emission ammeter with an input signal supplied through the sequencer 49, the multifunctional temperature controller 43, and the thyristor 48. The filament power source 41 further controls the filament current value so that the emission current value becomes 7.1 A. In this manner, a one-minute annealing treatment is performed. At this point, the accelerating voltage (HV) is fixed at −1800 V. Through the control performed over the emission current value so far, the overshoot temperature during the one-minute annealing temperature holding period becomes 1577 degrees centigrade, which is only 2 degrees centigrade higher.

(9) In a ninth process, when the one-minute annealing treatment is finished, as shown in FIG. 8, the filament current value is controlled to be 20 A, and the accelerating voltage (HV) is maintained at −1500 V. The emission current value is reduced to almost 0 A, and the SiC substrate 21 is cooled. At this point, the distance between the heat release face of the heater 10 and the SiC substrate 21 is extended from 5 mm to 72 mm, to achieve rapid cooling.

(10) In a tenth process, when the bottom face temperature of the substrate stage 20 becomes 1200 degrees centigrade, the distance between the heat release face of the heater 10 and the SiC substrate 21 is changed from 72 mm to 198 mm (a transfer level), and the water-cooled shutter 24 is closed. The SiC substrate 21 is then removed by the transfer robot. The time required from the introduction of the SiC substrate 21 into the vacuum container 3 followed by the activation annealing treatment to the removal of the SiC substrate 21 from the vacuum container 3 is 9 minutes 24 seconds. Accordingly, it has become apparent that five or more substrates can be treated per hour.

Lastly, the slit valve 22 of the electron bombardment heating apparatus 1 is opened, and the SiC substrate 21 is transferred out of the vacuum container 3 by the transfer robot.

In the operation of this example, the processing time for each substrate was 9 minutes 24 seconds, and the temperature stability was represented by +1 degrees centigrade and −5 degrees centigrade. Further, ten SiC substrates 21 were set in a cassette, and the series of operations for evacuation, transfer, heating treatment, transfer, to ventilation were performed. The processing time was 1 hour 47 minutes, and the throughput of five substrates or more per hour was achieved.

In this example, the annealing time is one minute, which is short. However, the annealing time may be as long as five to ten minutes in some kinds of samples or in a case where the annealing treatment is performed at a low temperature. In such a case, after the temperature reaches a preset annealing temperature, the emission current value is increased or reduced depending on time periods. For example, in a case where the substrate stage temperature is 1575 degrees centigrade, and the annealing is performed for ten minutes, 3-minute annealing may be first performed at 7.1 A, and further 3-minute annealing may be performed at 7.0 A during the time period between the third minute and the sixth minute, followed by 4-minute annealing at 6.9 A during the time period between the sixth minute and the tenth minute.

Example 2

Example 2 concerns a case where the same substrate as that used in Example 1 is used, and a one-minute activation annealing treatment is performed at 1500 degrees centigrade.

The initial temperature increase, the temperature ranges I, II, and III, and the preset temperature and the emission current value in the annealing treatment in processes (4) through (8) carried out after the temperature was increased at 3 A for 90 seconds to perform degassing, and the bottom face temperature of the substrate stage 20 reached 1200 degrees centigrade in Example 1 were replaced with the values shown in Table 1. Other than that, the substrate was treated in the same manner as in Example 1.

TABLE 1

|  | bottom face temperature of substrate stage | emission current |
|---|---|---|
| initial temperature | (1200 degrees centigrade) to 1440 degrees centigrade | 9.5 A |
| temperature range I | 1440 degrees centigrade to 1460 degrees centigrade | 8.0 A |
| temperature range II | 1460 degrees centigrade to 1480 degrees centigrade | 7.0 A |
| temperature range III | 1480 degrees centigrade to 1500 degrees centigrade | 6.0 A |
| annealing (60 seconds) | 1500 degrees centigrade | 5.8 A |

Example 3

Example 3 concerns a case where the same substrate as that used in Example 1 is used, and a one-minute activation annealing treatment is performed at 1550 degrees centigrade.

The initial temperature increase, the temperature ranges I, II, and III, and the preset temperature and the emission current value in the annealing treatment in processes (4) through (8) carried out after the temperature was increased at 3 A for 90 seconds to perform degassing, and the bottom face temperature of the substrate stage 20 reached 1200 degrees centigrade in Example 1 were replaced with the values shown in Table 2. Other than that, the substrate was treated in the same manner as in Example 1.

TABLE 2

|  | bottom face temperature of substrate stage | emission current |
|---|---|---|
| initial temperature | (1200 degrees centigrade) to 1490 degrees centigrade | 10.1 A |
| temperature range I | 1490 degrees centigrade to 1510 degrees centigrade | 9.2 A |
| temperature range II | 1510 degrees centigrade to 1530 degrees centigrade | 8.0 A |
| temperature range III | 1530 degrees centigrade to 1550 degrees centigrade | 7.0 A |
| annealing (60 seconds) | 1550 degrees centigrade | 6.8 A |

Example 4

Example 4 concerns a case where the same substrate as that used in Example 1 is used, and a one-minute activation annealing treatment is performed at 1600 degrees centigrade.

The initial temperature increase, the temperature ranges I, II, and III, and the preset temperature and the emission current value in the annealing treatment in processes (4) through (8) carried out after the temperature was increased at 3 A for 90 seconds to perform degassing, and the bottom face temperature of the substrate stage 20 reached 1200 degrees centigrade in Example 1 were replaced with the values shown in Table 3. Other than that, the substrate was treated in the same manner as in Example 1.

TABLE 3

|  | bottom face temperature of substrate stage | emission current |
|---|---|---|
| initial temperature | (1200 degrees centigrade) to 1540 degrees centigrade | 10.4 A |
| temperature range I | 1540 degrees centigrade to 1560 degrees centigrade | 9.8 A |
| temperature range II | 1560 degrees centigrade to 1580 degrees centigrade | 8.8 A |

TABLE 3-continued

|  | bottom face temperature of substrate stage | emission current |
|---|---|---|
| temperature range III | 1580 degrees centigrade to 1600 degrees centigrade | 7.7 A |
| annealing (60 seconds) | 1600 degrees centigrade | 7.4 A |

In each of Examples 2 through 4, excellent results were achieved as in Example 1. That is, according to the present invention, hunting of the annealing temperature is restrained, and rapid heating is performed at ultrahigh temperatures. Accordingly, the impurities implanted in the SiC substrate 21 can be activated with excellent reproducibility and high throughput. Thus, the manufacturing costs required for manufacturing silicon carbide (SiC) semiconductor devices can be dramatically lowered.

DESCRIPTION OF SYMBOLS 1 substrate heat treatment apparatus (electron bombardment heating apparatus)
2a treatment chamber
3 vacuum container
10 heating apparatus
11 heating container
14 filament
21 substrate to be treated
42 accelerating power source
46 accelerating voltage meter
47 emission ammeter

The invention claimed is:

1. A computer-readable recording medium on which a temperature control program is recorded,
   wherein the temperature control program is for a substrate heat treatment apparatus that includes a conductive heating container in an evacuable treatment chamber, and subjects a substrate to a heat treatment with heat of the heating container, a filament being incorporated into the heating container, thermal electrons generated from the filament being accelerated by an accelerating voltage applied between the filament and the heating container from an accelerating power source, the heating container being heated by causing the accelerated thermal electrons to collide with the heating container, the program causing a control apparatus of the substrate heat treatment apparatus to:
   increase a treatment temperature while controlling an emission current so as to be at a fixed value;
   continue the treatment temperature increase while reducing the emission current in a stepwise manner, after the treatment temperature reaches a preset temperature, before reaching an annealing temperature; and
   maintain the treatment temperature at a fixed value while controlling the emission current until an annealing treatment is completed, after the treatment temperature reaches the annealing temperature.

2. The computer-readable recording medium according to claim 1, wherein the treatment temperature is increased while the emission current is maintained at a fixed value.

3. The computer-readable recording medium according to claim 1, wherein the treatment temperature is maintained at the fixed value, while the emission current is controlled, at a point when the treatment temperature reaches the annealing temperature.

4. The computer-readable recording medium according to claim 1, wherein, when the annealing temperature is 1500 to 2000 degrees centigrade, the preset temperature is set at a temperature that is lower than the annealing temperature by 40 to 100 degrees centigrade.

* * * * *